United States Patent
Hwu et al.

(10) Patent No.: US 8,445,936 B1
(45) Date of Patent: May 21, 2013

(54) INTEGRALLY FORMED HIGH-EFFICIENT MULTI-LAYER LIGHT-EMITTING DEVICE

(75) Inventors: Jon-Fwu Hwu, Hsinchu (TW); Yung-Fu Wu, Hsinchu (TW); Kui-Chiang Liu, Hsinchu (TW)

(73) Assignee: Gem Weltronics TWN Corporation, Hsinchu County (TW)

( * ) Notice: Subject to any disclaimer, the term of this patent is extended or adjusted under 35 U.S.C. 154(b) by 0 days.

(21) Appl. No.: 13/495,196

(22) Filed: Jun. 13, 2012

(51) Int. Cl.
*H01L 33/62* (2010.01)

(52) U.S. Cl.
USPC ............... 257/99; 257/19; 257/79; 257/100; 257/E51.018; 257/E33.054

(58) Field of Classification Search
USPC ...... 257/13, 79–103, 918, E51.018–E51.022, 257/E33.001–E33.077, E33.054, E25.028, 257/E25.032
See application file for complete search history.

(56) References Cited

U.S. PATENT DOCUMENTS

| | | | | |
|---|---|---|---|---|
| 7,824,077 | B2 * | 11/2010 | Chen et al. | 362/345 |
| 2010/0044589 | A1 * | 2/2010 | Garcia et al. | 250/492.1 |
| 2010/0117534 | A1 * | 5/2010 | Chen | 315/32 |
| 2011/0037368 | A1 * | 2/2011 | Huang | 313/46 |
| 2013/0058080 | A1 * | 3/2013 | Ge et al. | 362/231 |

* cited by examiner

*Primary Examiner* — Mamadou Diallo

(57) ABSTRACT

An integrally formed high-efficient multi-layer light-emitting device is provided, which includes a heat dissipation seat, a plurality of light-emitting dies, and a lead frame. The heat dissipation seat includes a chamber having an accommodating space, and a groove having two inclined inner sidewalls is formed around the periphery of a bottom of the chamber, The groove is very fine so that only very small amounts of the phosphor and silicone are used for filling the groove and covering the light-emitting dies, and thereby the material cost and the manufacturing cost are greatly reduced. The light can be reflected out of the chamber so that the brightness and the evenness of the light output will be improved.

13 Claims, 9 Drawing Sheets

INTEGRALLY FORMED HIGH-EFFICIENT MULTI-LAYER LIGHT-EMITTING DEVICE

BACKGROUND OF THE INVENTION

1. Field of the Invention

The present invention relates to a light-emitting device, and more particularly to an integrally formed high-efficient multi-layer light-emitting device, in which the brightness and the evenness of the light output will be improved, and the amounts of the phosphor and silicone used are reduced.

2. The Prior Arts

The light-emitting theory of LED takes advantage of the intrinsic properties of semiconductors, which is different from the theory of electric discharging, heat and light-emitting of an incandescent light tube. Because light is emitted when electric current forward flowed across the PN junction of a semiconductor, the LED is also called cold light. The LED has the features of high durability, long service life, light weight, low power consumption, and being free of toxic substances like mercury, and thereby it can be widely used in the industry of the light-emitting device, and the LEDs are often arranged in an array and often used in such as electric bulletin board or traffic sign.

Conventionally, a phosphor layer is formed on the light-emitting surface. Usually, a solution containing the phosphor is filled, coated, or dropped on the light-emitting surface. The phosphor layer is capable of absorbing at least a portion of the first color light emitted by the light-emitting dies, and subsequently emitting a second color light, and the first color light and the second color light will be mixed together in the phosphor layer to produce the desired color light.

FIG. 1 is a cross-sectional view showing a package structure of an array type multi-layer LED according to the prior art. Referring to FIG. 1, the array type multi-layer LED package structure includes a substrate 10a, a plurality of LED dies 18a, a package module 12a, a lead frame 14a, and a mask 16a, wherein the substrate 10a was disposed on the bottom of the package structure, and the package module 12a was used for encapsulating the substrate 10a and the lead frame 14a. The LED dies 18a were arranged in an array on the substrate 10a. The substrate 10a is made of metal. The LED dies 18a and the lead frame 14a were electrically connected with each other. The mask 16a covered the package module 12a. An insulating protection layer 20a covered the LED dies 18a. A phosphor layer 22a was formed on the insulating protection layer 20a.

However, in order to increase the brightness of the conventional LED package structure, enough space should be left for disposing a plurality of LED dies in the package module 12a. The large amounts of the phosphor and silicone are required to form the phosphor layer 22a and the insulating protection layer 20a for covering the LED dies 18a, and thereby the material cost is greatly increased. Furthermore, the LED dies 18a are often arranged in an array, and thereby the light emitted by the LED dies 18a arranged in different rows will hit the inner sidewall of the package module 12a at different angles so that the reflected light will cross over each other, and thereby the evenness of the light output will be poor. Accordingly, it is desirable to provide an integrally formed high-efficient multi-layer light-emitting device capable of solving the problems existing in the conventional LED package structure.

SUMMARY OF THE INVENTION

An objective of the present invention is to provide an integrally formed high-efficient multi-layer light-emitting device. The integrally formed high-efficient multi-layer light-emitting device includes a heat dissipation seat, including a chamber having an accommodating space, the chamber being formed on a top of the heat dissipation seat, a groove being formed in a bottom of the chamber, the groove having two inclined inner sidewalls so that the light is reflected out of the chamber by the two inclined inner sidewalls, the heat dissipation seat having at least one through hole longitudinally formed therein; a plurality of light-emitting dies, disposed in the groove, the light-emitting dies being spaced away from each other, the light-emitting dies being electrically connected with each other by wire-bonding with use of metal wires; and a lead frame, disposed in the at least one through hole, an upper and a lower portions of the at least one through hole being sealed by a sealant so that the lead frame is fixed in the at least one through hole, the lead frame including two conductive rods and a sleeve, the two conductive rods being disposed in the sleeve, two ends of each conductive rod being extended out of the sleeve, the two conductive rods being electrically connected with the light-emitting dies by wire-bonding with use of metal wires.

A phosphor layer and a silicone protection layer are formed in the groove. The groove is very fine so that only very small amounts of the phosphor and silicone are used for filling the groove and covering the light-emitting dies, and thereby the material cost and the manufacturing cost are greatly reduced.

Moreover, when all of the light, which is emitted from the light-emitting dies disposed in the groove, is reflected from the two inclined inner sidewalls at substantially the same angle, the evenness of the light output will be improved. Therefore, in the present invention, the evenness of the light output will be improved, and the amounts of the phosphor and silicone used are reduced.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
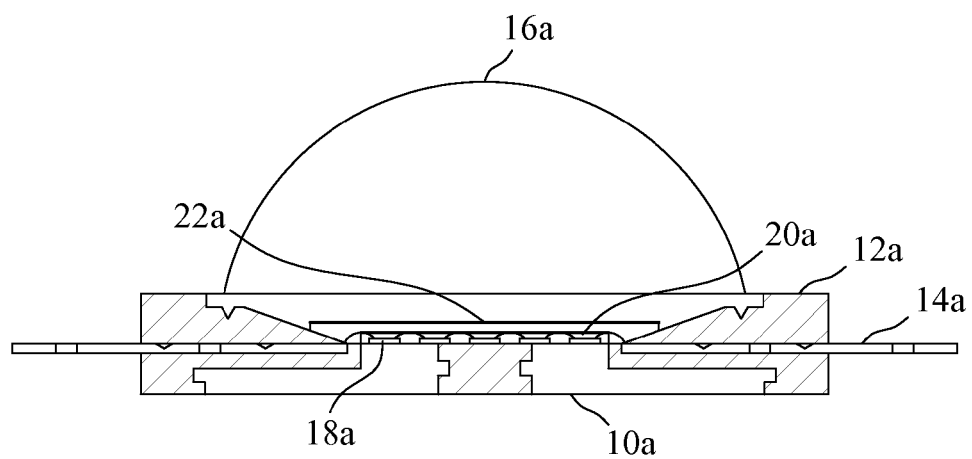
FIG. 1 is a cross-sectional view showing a package structure of an array type multi-layer LED according to the prior art.
Figure 2:
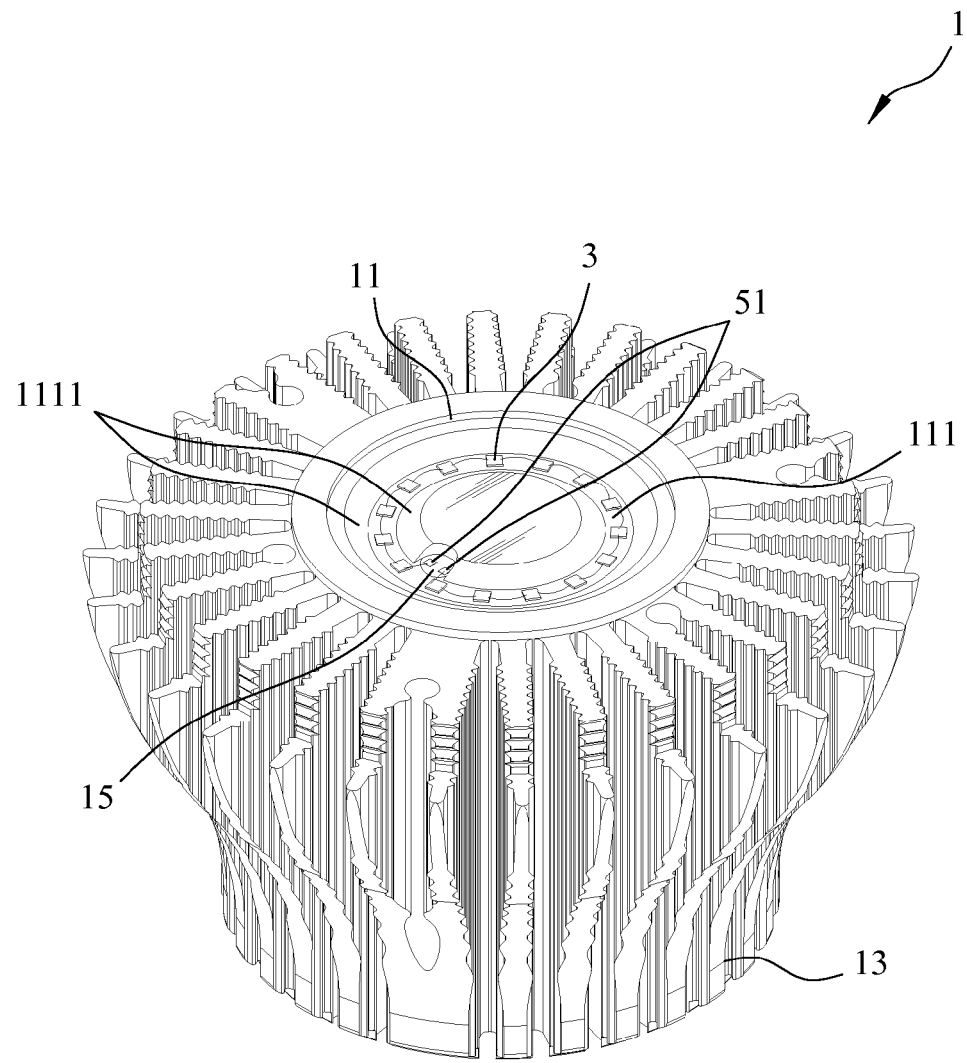
FIG. 2 is a schematic perspective view showing an integrally formed high-efficient multi-layer light-emitting device according to a first embodiment of the present invention.

FIG. 2 is a schematic perspective view showing an integrally formed high-efficient multi-layer light-emitting device according to a first embodiment of the present invention. Referring to FIG. 2, the integrally formed high-efficient multi-layer light-emitting device includes a heat dissipation seat 1, a plurality of light-emitting dies 3, and a lead frame 5.

The heat dissipation seat 1 includes a chamber 11 having an accommodating space, which is formed on the central portion of the top of the heat dissipation seat 1. A groove 111 is formed around the periphery of the bottom of the chamber 11. The light-emitting dies 3 are disposed in the groove 111, spaced away from each other, and electrically connected with each other by wire-bonding with use of the metal wires. The groove 111 is formed by a milling process.

The heat dissipation seat 1 includes a plurality of heat dissipation fins 13. The heat dissipation fins 13 are extended radially outward from the outer sidewall of the heat dissipation seat 1. These heat dissipation fins 13 are spaced around the circumference of the heat dissipation seat 1, and two sides of each heat dissipation fin 13 are designed to have a corrugated shape.

The light-emitting dies 3 are spaced away from each other so that the heat accumulation will not occur between the light-emitting dies 3. The heat generated during the light emitting of the light-emitting dies 3 will be quickly dissipated to the atmosphere through the space left between the light-emitting dies 3.

The groove 111 has two inclined inner sidewalls 1111 faced with each other so that the light can be reflected out of the chamber 11 by the two inclined inner sidewalls 1111. An included angle between each inclined inner sidewall 1111 and the bottom of the chamber 11 can be set between 10° to 80°. In the first embodiment of the present invention, the groove 111 having a ring shape is taken as an example to illustrate the present invention. However, the groove 111 of the present invention is not limited to any particular shape.

Two metal reflective layers can be respectively formed on the two inclined inner sidewalls 1111 to increase the reflection effect, and the metal reflective layers can be made of copper, silver, or any other suitable metals.

The groove 111 can have a shape of ring, square, rectangle, triangle, or any other suitable shapes.

Figure 3:
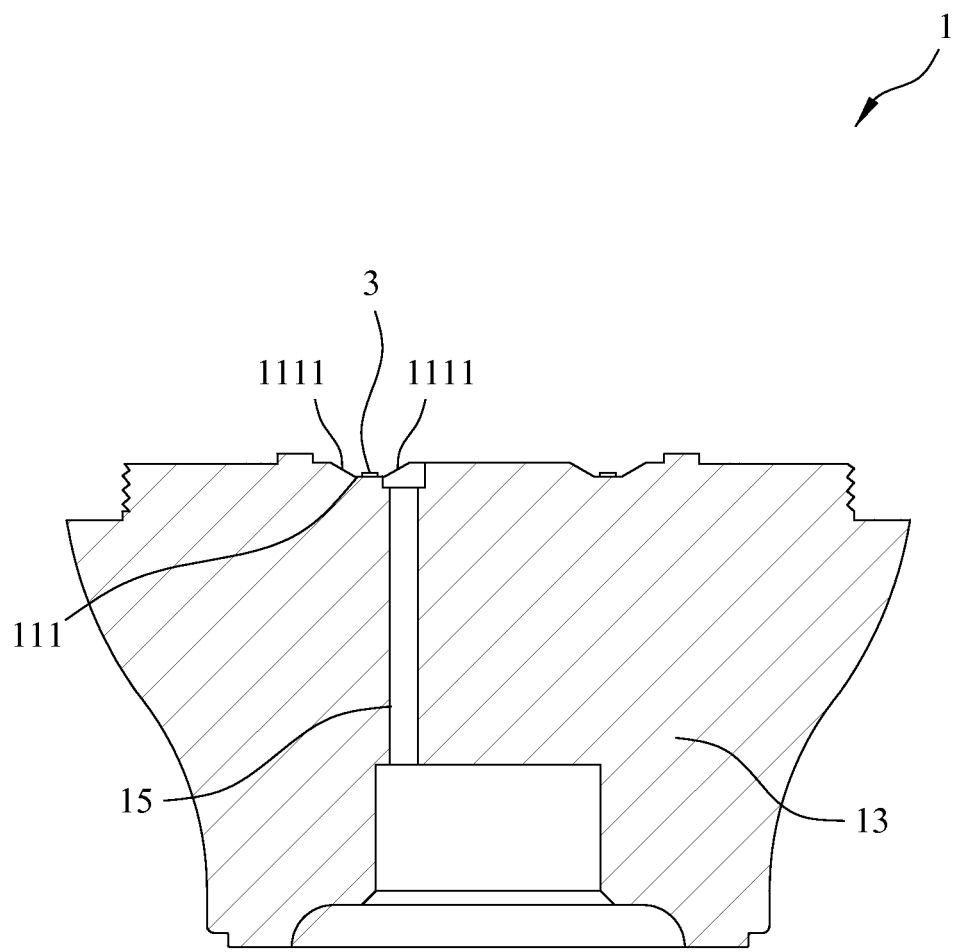
FIG. 3 is a cross-sectional view of the heat dissipation seat of the first embodiment of the present invention.
Figure 4:
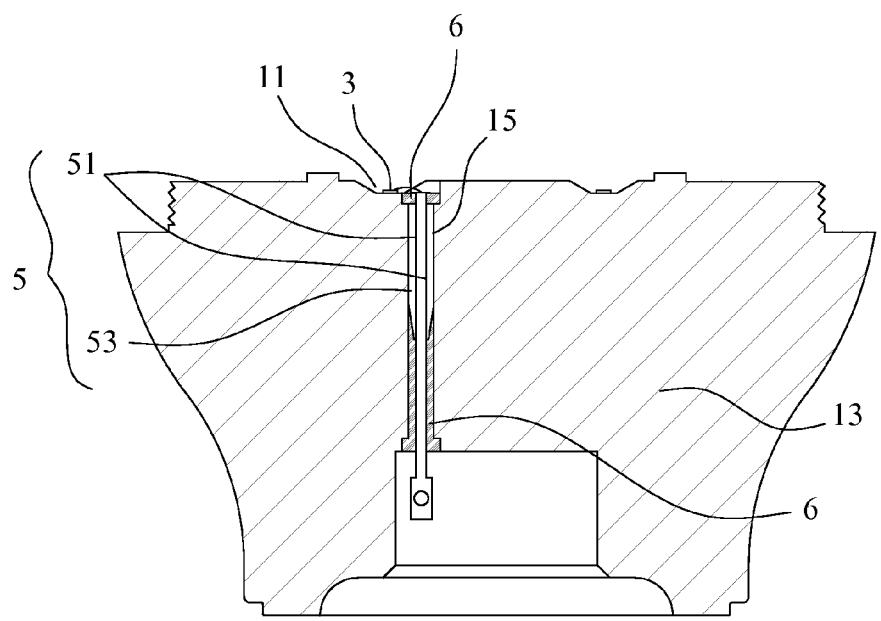
FIG. 4 is a cross-sectional view of the heat dissipation seat and the lead frame of the first embodiment of the present invention.

FIG. 3 is a cross-sectional view of the heat dissipation seat of the first embodiment of the present invention. FIG. 4 is a cross-sectional view of the heat dissipation seat and the lead frame of the first embodiment of the present invention. Referring to FIGS. 3 and 4, the heat dissipation seat has one through hole 15 longitudinally formed therein. The top and the bottom ends of the through hole 15 are respectively located at the bottom of the chamber 11 and the bottom of the heat dissipation seat 1. One lead frame 5 is disposed in the through hole 15. The sealant 6 is used to completely seal the upper and lower portions of the through hole 15. By using the sealant 6, the lead frame 5 can be fixed in the through hole 15, and the moisture and fine particles in air can be prevented from entering the chamber 11. The sealant 6 can be a silicone sealant.

The lead frame 5 includes two conductive rods 51 and a sleeve 53, and the two conductive rods 51 are disposed in the sleeve 53 in such a manner that the two conductive rods 51 are not contacted with each other. The two ends of each conductive rod 51 are extended out of the sleeve 53. The sleeve 53 can be made of polyphthalamide (PPA), polyamide 9T (PA9T), or liquid crystalline polyester resin (LCP).

The top end of each conductive rod 51 is electrically connected with the light-emitting dies 3 by wire-bonding with the use of the metal wires. The bottom ends of the two conductive rods 51 can be respectively electrically connected with the negative and the positive ends of the electrical power source. The light-emitting dies 3 can emit light when the electrical power source is turned on. The metal wires are preferably made of gold.

Figure 5:
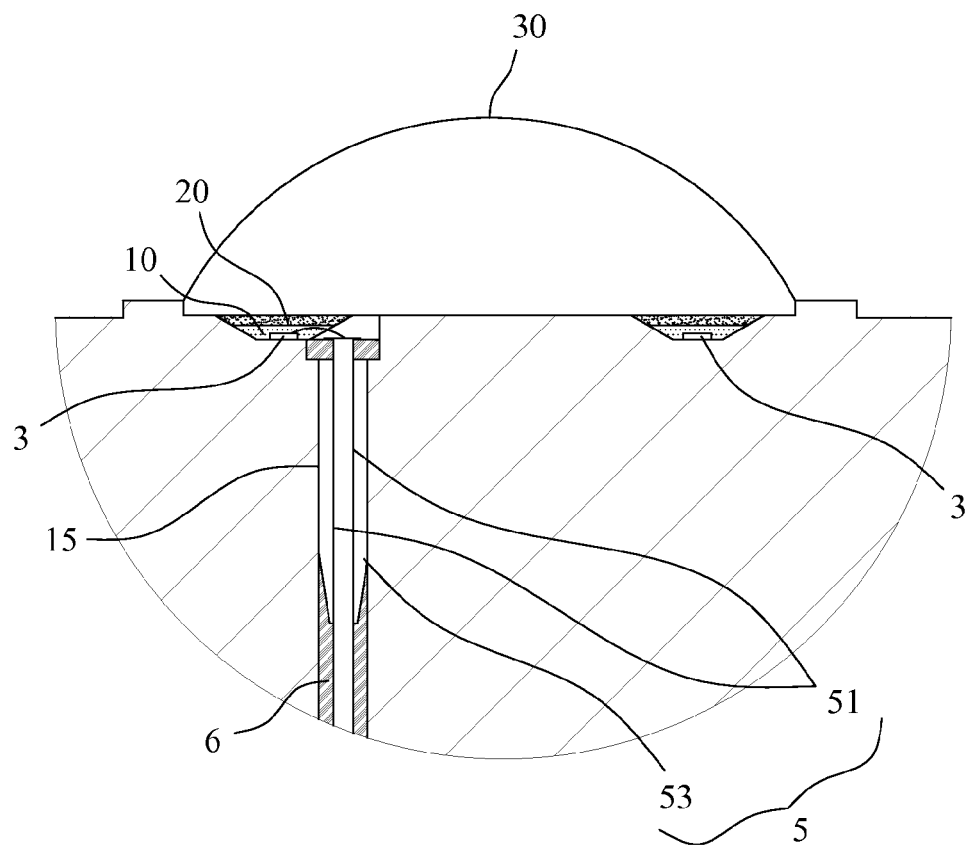
FIG. 5 is a schematic view showing the integrally formed high-efficient multi-layer light-emitting device further including a phosphor layer and a silicone protection layer according to the first embodiment of the present invention.

FIG. 5 is a schematic view showing the integrally formed high-efficient multi-layer light-emitting device further including a phosphor layer and a silicone protection layer according to the first embodiment of the present invention. Referring to FIG. 5, the integrally formed high-efficient multi-layer light-emitting device of the first embodiment of the present invention can further includes a phosphor layer 10 and a silicone protection layer 20. The phosphor layer 10 and the silicone protection layer 20 are disposed in the groove 111 by filling or dispensing method, and are sequentially formed on the light-emitting dies 3. The phosphor layer 10 covering the light-emitting dies 3 is used for light mixing when the light emitted from the light-emitting dies 3 passed through it, and the silicone protection layer 20 is used for preventing the moisture and fine particles in air from entering the phosphor layer 10. The silicone protection layer 20 is preferably made of silicone with high optical transmittance.

The groove 111 is very fine so that only very small amounts of the phosphor and silicone are required to be used for filling the groove 111 and covering the light-emitting dies 3, and thereby the material cost and the manufacturing cost are greatly reduced.

The integrally formed high-efficient multi-layer light-emitting device of the present invention can further includes a lens mask 30 disposed on the chamber 11 so that the chamber 11 having an accommodating space can be sealed by the lens mask 10, and the moisture and fine particles in air can be prevented from entering the chamber 11.

Figure 6:
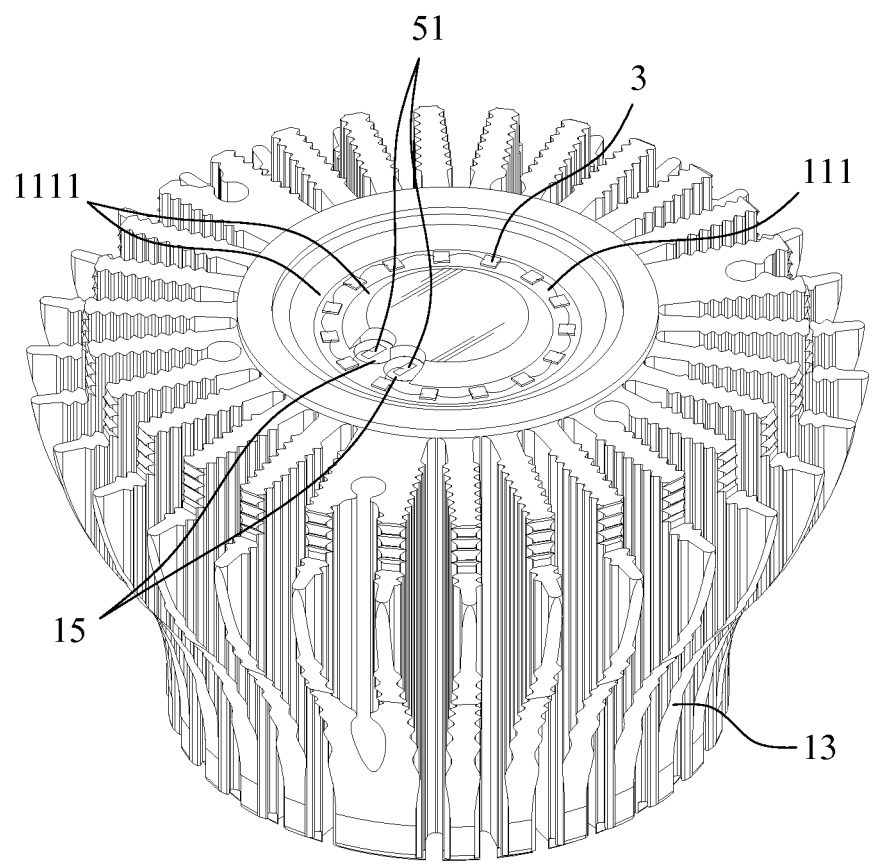
FIG. 6 is a schematic view showing an integrally formed high-efficient multi-layer light-emitting device according to a second embodiment of the present invention.

FIG. 6 is a schematic view showing an integrally formed high-efficient multi-layer light-emitting device according to a second embodiment of the present invention. The integrally formed high-efficient multi-layer light-emitting device according to the second embodiment of the present invention is the same as that of the first embodiment of the present invention except that the heat dissipation seat 1 has two adjacent through holes 15 longitudinally formed therein, and two lead frame 5 are respectively disposed in the two through holes 15. In the second embodiment of the present invention, only one conductive rod 51 is disposed in the sleeve 53, as shown in FIG. 6.

Figure 7:
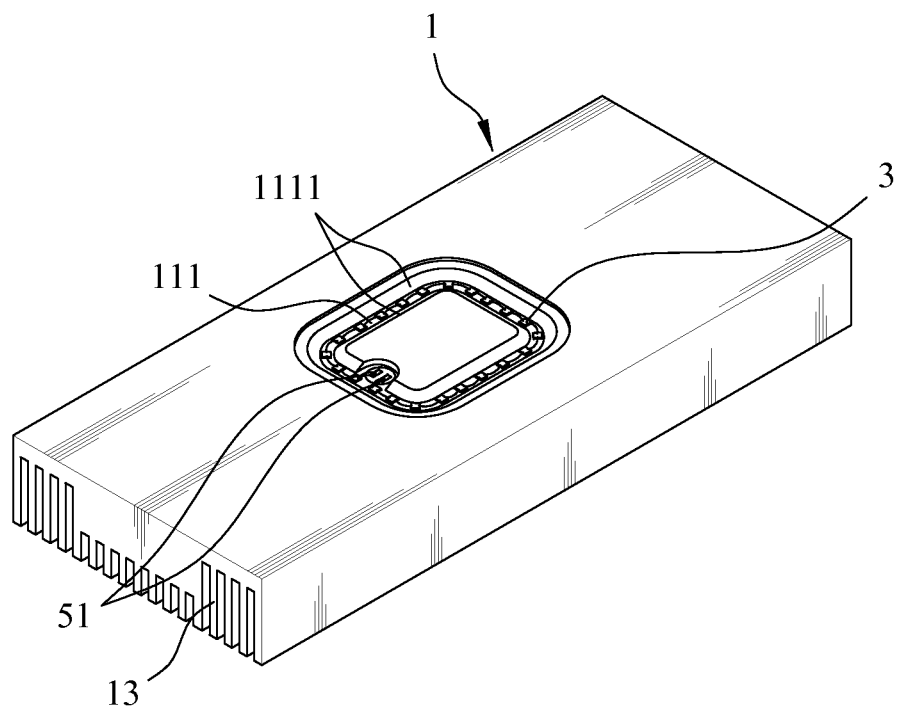
FIG. 7 is a schematic view showing an integrally formed high-efficient multi-layer light-emitting device according to a third embodiment of the present invention.
Figure 8:
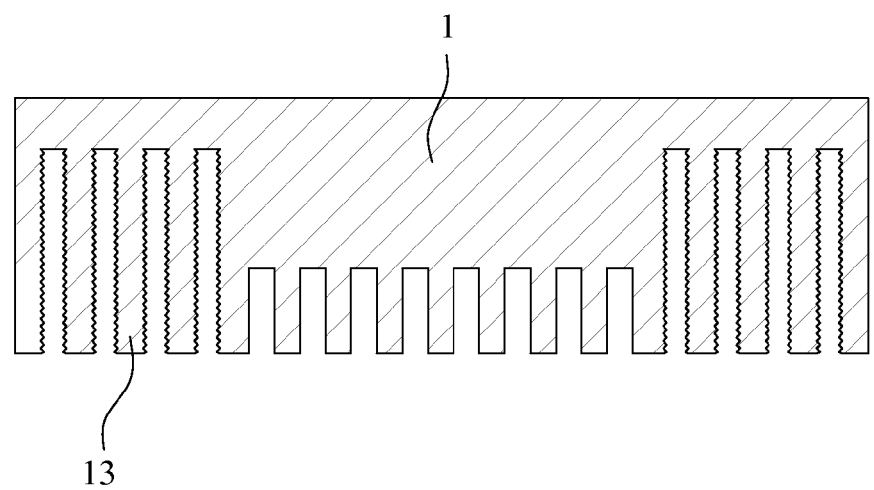
FIG. 8 is a side view of FIG. 7.

FIG. 7 is a schematic view showing an integrally formed high-efficient multi-layer light-emitting device according to a third embodiment of the present invention. FIG. 8 is a side view of FIG. 7. Referring to FIG. 7, the heat dissipation seat 1 has a plate shape, and the heat dissipation seat 1 is thicker in the central portion than in the peripheral portion. A plurality of heat dissipation fins 13 are extended downward from the bottom of the heat dissipation seat 1. These heat dissipation fins 13 are spaced away from each other, and the lengths of the heat dissipation fins 13 in the peripheral portion are longer than the lengths of the heat dissipation fins 13 in the central portion. The outer ends of the heat dissipation fins 13 are level with each other.

Two sides of each heat dissipation fin 13 in the peripheral portion are designed to have a corrugated shape. The heat dissipation areas of the corrugated heat dissipation fins 13 are much larger than those of the flat heat dissipation fins, and thereby the heat dissipation efficiency is greatly increased. Moreover, two sides of all of the heat dissipation fins 13 can be designed to have a corrugated shape to increase the heat dissipation efficiency.

Furthermore, the heat dissipation seat 1 is thicker in the central portion than in the peripheral portion so that the central portion of the heat dissipation seat 1 has strong structural strength for providing the chamber 11, the through hole 15, and the groove 111. The integrally formed high-efficient multi-layer light-emitting device according to the third embodiment of the present invention is the same as that of the first embodiment of the present invention except for the heat dissipation fins 13.

Therefore, from the third embodiment, it can realize that the chamber 11, the through hole 15, and the groove 111 can be formed in the various types of the heat dissipation seats 1.

Figure 9:
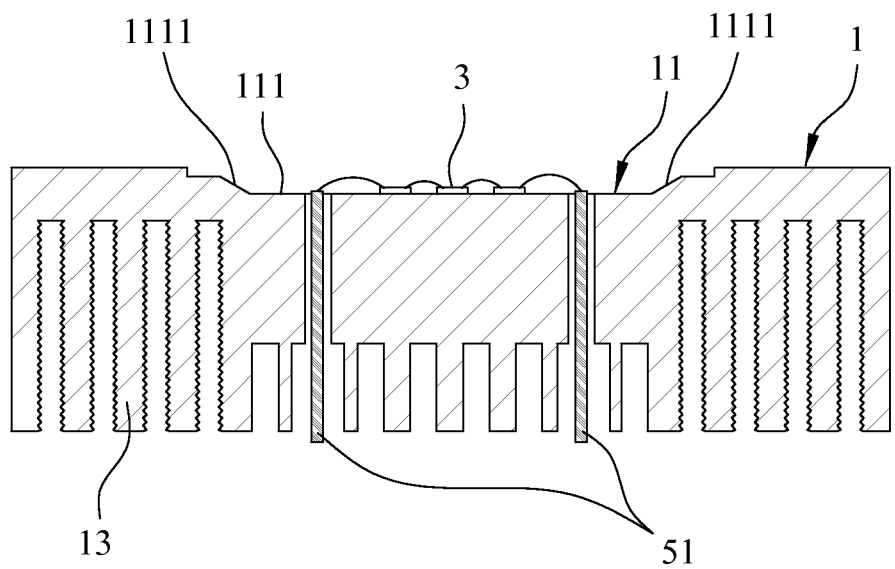
FIG. 9 is a schematic view showing an integrally formed high-efficient multi-layer light-emitting device according to a fourth embodiment of the present invention.

FIG. 9 is a schematic view showing an integrally formed high-efficient multi-layer light-emitting device according to a fourth embodiment of the present invention. The integrally formed high-efficient multi-layer light-emitting device according to the fourth embodiment of the present invention is the same as that of the third embodiment of the present invention except that in the third embodiment, the heat dissipation seat 1 has two adjacent through holes 15 longitudinally formed therein, and two lead frame 5 are respectively disposed in the two through holes 15, and in the fourth embodiment, only one conductive rod 51 is disposed in the sleeve 53, as shown in FIG. 9.

In the present invention, the groove 111 is very fine so that only very small amounts of the phosphor and silicone are required to be used for filling the groove 111 and covering the light-emitting dies 3, and thereby the material cost and the manufacturing cost are greatly reduced.

Furthermore, when all of the light, which is emitted from the light-emitting dies 3 disposed in the groove 111, is reflected from the two inclined inner sidewalls 1111 at substantially the same angle, the evenness of the light output will be improved.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. An integrally formed high-efficient multi-layer light-emitting device, comprising:
   a heat dissipation seat, including a chamber having an accommodating space, the chamber being formed on a top of the heat dissipation seat, a groove being formed in a bottom of the chamber, the groove having two inclined inner sidewalls so that the light is reflected out of the chamber by the two inclined inner sidewalls, the heat dissipation seat having at least one through hole longitudinally formed therein;
   a plurality of light-emitting dies, disposed in the groove, the light-emitting dies being spaced away from each other, the light-emitting dies being electrically connected with each other by wire-bonding with use of metal wires; and
   a lead frame, disposed in the at least one through hole, an upper and a lower portions of the at least one through hole being sealed by a sealant so that the lead frame is fixed in the at least one through hole, the lead frame including two conductive rods and a sleeve, the two conductive rods being disposed in the sleeve, two ends of each conductive rod being extended out of the sleeve, the two conductive rods being electrically connected with the light-emitting dies by wire-bonding with use of metal wires.

2. The light-emitting device according to claim 1, wherein the groove is formed by a milling process.

3. The light-emitting device according to claim 1, wherein the groove has a shape of ring, square, rectangle, or triangle.

4. The light-emitting device according to claim 1, wherein an included angle between each inclined inner sidewall and the bottom of the chamber is set between 10° to 80°.

5. The light-emitting device according to claim 1, wherein the metal wires are made of gold.

6. The light-emitting device according to claim 1, wherein the sealant is a silicone sealant.

7. The light-emitting device according to claim 1, further comprising a phosphor layer and a silicone protection layer, wherein the phosphor layer and the silicone protection layer are disposed in the groove, and are sequentially formed on the light-emitting dies.

8. The light-emitting device according to claim 7, further comprising a lens mask disposed on the chamber so that the chamber having an accommodating space is sealed by the lens mask.

9. The light-emitting device according to claim 1, wherein the sleeve is made of polyphthalamide, polyamide 9T, or liquid crystalline polyester resin.

10. The light-emitting device according to claim 1, wherein two metal reflective layers are respectively formed on the two inclined inner sidewalls, and the metal reflective layer is made of copper, or silver.

11. An integrally formed high-efficient multi-layer light-emitting device, comprising:
    a heat dissipation seat with a plate shape, including a chamber having an accommodating space, the chamber being formed on a top of the heat dissipation seat, a groove being formed around a bottom of the chamber, the groove having two inclined inner sidewalls so that the light is reflected out of the chamber by the two inclined inner sidewalls, the heat dissipation seat having at least one through hole longitudinally formed therein;
    a plurality of light-emitting dies, disposed in the groove, the light-emitting dies being spaced away from each other, the light-emitting dies being electrically connected with each other by wire-bonding with use of metal wires; and
    a lead frame, disposed in the at least one through hole, an upper and a lower portions of the at least one through hole being sealed by a sealant so that the lead frame is fixed in the at least one through hole, the lead frame including two conductive rods and a sleeve, the two conductive rods being disposed in the sleeve, two ends of each conductive rod being extended out of the sleeve, the two conductive rods being electrically connected with the light-emitting dies by wire-bonding with use of metal wires.

12. The light-emitting device according to claim 11, wherein a central portion of the heat dissipation seat is thicker than a peripheral portion of the heat dissipation seat, and a plurality of heat dissipation fins are extended downward from a bottom of the heat dissipation seat, and the heat dissipation fins are spaced away from each other, and lengths of the heat dissipation fins in the peripheral portion are longer than lengths of the heat dissipation fins in the central portion.

13. The light-emitting device according to claim 12, wherein two sides of each heat dissipation fin have a corrugated shape.

* * * * *